(12) United States Patent
Lee et al.

(10) Patent No.: US 11,323,654 B2
(45) Date of Patent: May 3, 2022

(54) ELECTRONIC DEVICE AND METHOD CAPABLE OF COMPRESSING IMAGE ON BASIS OF ATTRIBUTES OF IMAGE DATA

(71) Applicant: Samsung Electronics Co., Ltd., Gyeonggi-do (KR)

(72) Inventors: Chang Woo Lee, Gyeonggi-do (KR); Do Han Kim, Gyeonggi-do (KR); Jin Min Bang, Gyeonggi-do (KR)

(73) Assignee: Samsung Electronics Co., Ltd

( * ) Notice: Subject to any disclaimer, the term of this patent is extended or adjusted under 35 U.S.C. 154(b) by 290 days.

(21) Appl. No.: 16/632,804

(22) PCT Filed: Jun. 21, 2018

(86) PCT No.: PCT/KR2018/007013
§ 371 (c)(1),
(2) Date: Jan. 21, 2020

(87) PCT Pub. No.: WO2019/017599
PCT Pub. Date: Jan. 24, 2019

(65) Prior Publication Data
US 2021/0152776 A1    May 20, 2021

(30) Foreign Application Priority Data
Jul. 21, 2017    (KR) .......................... 10-2017-0092591

(51) Int. Cl.
*H04N 5/92*    (2006.01)
*H04N 5/917*    (2006.01)
(Continued)

(52) U.S. Cl.
CPC ............. *H04N 5/917* (2013.01); *G11B 27/10* (2013.01); *H04N 5/2351* (2013.01);
(Continued)

(58) Field of Classification Search
CPC ........ H01L 27/146; G11B 27/10; H04N 9/64; H04N 9/8042; H04N 9/04555;
(Continued)

(56) References Cited

U.S. PATENT DOCUMENTS 6,647,143 B1    11/2003    Nakashima
7,609,301 B2    10/2009    Kaku
(Continued)

FOREIGN PATENT DOCUMENTS

JP    2001094792         4/2001
JP    2004214733 A *    7/2004
(Continued)

OTHER PUBLICATIONS

Korean Office Action dated Jun. 12, 2021 issued in counterpart application No. 10-2017-0092591, 15 pages.
(Continued)

*Primary Examiner* — Robert Chevalier
(74) *Attorney, Agent, or Firm* — The Farrell Law Firm, P.C.

(57) ABSTRACT

According to various embodiments of the disclosure, disclosed is an electronic device including a processor and an image sensor module. The image sensor module includes an image sensor in which sensor pixels are arranged and a control circuit electrically connected to the image sensor and connected to the processor. The control circuit is configured to obtain raw image data including pieces of image pixel data, in which first pixel data corresponding to a first attribute and second pixel data corresponding to a second attribute are arranged in a first array, to identify rearrangement information predetermined based on the first attribute and the second attribute, to change the array of the pieces of image pixel data into a second array based on the rearrangement information such that at least part of the first pixel data
(Continued)

is arranged adjacent and at least part of the second pixel data is arranged adjacent, to generate compression data obtained by compressing the pieces of image pixel data whose array is changed into the second array, and to transmit the compression data to the processor. The processor is configured to restore the raw image data. Other various embodiments as understood from the specification are also possible.

15 Claims, 11 Drawing Sheets

(51) Int. Cl.
H04N 19/136 (2014.01)
H04N 19/186 (2014.01)
G11B 27/10 (2006.01)
H04N 5/235 (2006.01)
H04N 5/77 (2006.01)
H04N 9/64 (2006.01)

(52) U.S. Cl.
CPC ............ *H04N 5/772* (2013.01); *H04N 9/64* (2013.01); *H04N 19/136* (2014.11); *H04N 19/186* (2014.11)

(58) Field of Classification Search
CPC .... H04N 19/186; H04N 19/88; H04N 19/136; H04N 5/3745; H04N 5/355; H04N 5/917; H04N 5/2351; H04N 5/341; H04N 5/772; H04N 5/77; H04N 5/35554; H04N 1/21
USPC ............. 348/222.1, 326, 328, 329, 330, 353
See application file for complete search history.

(56) References Cited

U.S. PATENT DOCUMENTS

| | | | |
|---|---|---|---|
| 7,830,967 B1 | 11/2010 | Jannard et al. | |
| 8,174,560 B2 | 5/2012 | Jannard et al. | |
| 8,237,830 B2 | 8/2012 | Jannard et al. | |
| 8,358,357 B2 | 1/2013 | Jannard et al. | |
| 8,687,086 B1 | 4/2014 | Campbell et al. | |
| 8,768,072 B2 | 7/2014 | Jang | |
| 8,872,933 B2 | 10/2014 | Jannard et al. | |
| 8,878,952 B2 | 11/2014 | Jannard et al. | |
| 8,970,726 B2 | 3/2015 | Campbell et al. | |
| 9,019,393 B2 | 4/2015 | Jannard et al. | |
| 9,230,299 B2 | 1/2016 | Jannard et al. | |
| 9,245,314 B2 | 1/2016 | Jannard et al. | |
| 9,253,421 B2 | 2/2016 | Campbell et al. | |
| 9,338,373 B2 | 5/2016 | Campbell et al. | |
| 9,436,976 B2 | 9/2016 | Jannard et al. | |
| 9,596,385 B2 | 3/2017 | Jannard et al. | |
| 9,787,878 B2 | 10/2017 | Jannard et al. | |
| 9,792,672 B2 | 10/2017 | Jannard et al. | |
| 10,326,904 B2 | 6/2019 | Campbell et al. | |
| 2006/0153539 A1 | 7/2006 | Kaku | |
| 2008/0291319 A1 | 11/2008 | Jannard et al. | |
| 2009/0103817 A1 | 4/2009 | Jang | |
| 2010/0013963 A1 | 1/2010 | Jannard et al. | |
| 2010/0265367 A1 | 10/2010 | Jannard et al. | |
| 2010/0322597 A1 | 12/2010 | Gharavi-Alkhansari et al. | |
| 2012/0294582 A1 | 11/2012 | Jannard et al. | |
| 2012/0301102 A1 | 11/2012 | Jannard et al. | |
| 2013/0113951 A1 | 5/2013 | Jannard et al. | |
| 2015/0002695 A1 | 1/2015 | Jannard et al. | |
| 2015/0003730 A1 | 1/2015 | Jannard et al. | |
| 2015/0003801 A1 | 1/2015 | Jannard et al. | |
| 2015/0348233 A1 | 12/2015 | Jannard et al. | |
| 2015/0382006 A1 | 12/2015 | Ikeda et al. | |
| 2016/0227068 A1 | 8/2016 | Campbell et al. | |
| 2016/0316106 A1 | 10/2016 | Jannard et al. | |
| 2017/0034400 A1 | 2/2017 | Jannard et al. | |
| 2017/0053385 A1 | 2/2017 | Jannard et al. | |
| 2017/0118453 A1 | 4/2017 | Kim et al. | |
| 2017/0127015 A1 | 5/2017 | Mochizuki | |
| 2017/0171423 A1 | 6/2017 | Campbell et al. | |
| 2018/0124290 A1 | 5/2018 | Jannard et al. | |
| 2018/0130183 A1 | 5/2018 | Jannard et al. | |
| 2019/0260901 A1 | 8/2019 | Campbell et al. | |

FOREIGN PATENT DOCUMENTS

| | | | |
|---|---|---|---|
| JP | 02012004636 A | * | 1/2012 |
| KR | 1020050040942 | | 5/2005 |
| KR | 1020100016214 | | 2/2010 |
| KR | 101266661 | | 5/2013 |
| KR | 101499545 | | 3/2015 |
| KR | 1020170048792 | | 5/2017 |
| WO | WO2017061738 A1 | * | 4/2017 |

OTHER PUBLICATIONS

PCT/ISA/210 Search Report issued on PCT/KR2018/007013, pp. 7.
PCT/ISA/237 Written Opinion issued on PCT/KR2018/007013, pp. 7.

* cited by examiner

ELECTRONIC DEVICE AND METHOD CAPABLE OF COMPRESSING IMAGE ON BASIS OF ATTRIBUTES OF IMAGE DATA

PRIORITY

This application is a National Phase Entry of PCT International Application No. PCT/KR2018/007013 which was filed on Jun. 21, 2018, and claims priority to Korean Patent Application No. 10-2017-0092591, which was filed on Jul. 21, 2017, the content of each of which is incorporated herein by reference.

TECHNICAL FIELD

Embodiments disclosed in this specification refer to an electronic device including an image sensor.

BACKGROUND ART

With the development of information technology (IT), various types of electronic devices such as a smartphone, a tablet personal computer (PC), and the like are being widely supplied.

In the meantime, the electronic devices may include a camera module. The camera module may be implemented with a digital camera that converts light into an electrical image signal and stores the electrical image signal as image data using an image sensor, not a traditional film camera. The user may capture an image using an electronic device, may store or edit the captured image, and may transmit the captured image to another terminal. With the trend of the high pixel of the camera module mounted in the electronic device, the size of the image data has recently increased.

DISCLOSURE

Technical Problem

In the camera module mounted in an electronic device, the size of image data is increasing gradually. The compression of the image data may be used to efficiently deliver the image data to a processor.

The image data consists of thousands of lines, and one line consists of thousands of pixel data. The compression of image data may be performed for each line. The compression rate of image data is affected depending on the amount of similarities of pixel data adjacent to each other. For example, as the attributes of data of pixels adjacent to each other are the same as each other, the compression rate becomes higher.

In general, the pixel data constituting the image data is in a specific array, and the arrangement of the array is different for each manufacturer. Furthermore, pixels having different attributes in the array may be arranged adjacent to each other to improve the quality of the image to be captured. In this case, the similarity degree of pixel data in the image data may be lowered. As a result, the compression rate of the image data is lowered inevitably, which may be disadvantageous in terms of the transmission efficiency of image data and the storage efficiency of an electronic device.

According to various embodiments of the disclosure, a method for improving the compression rate of the image data by rearranging the arrangement of the image data before the compression of the image data may be provided and an electronic device for performing the same.

Technical Solution

According to an embodiment disclosed in this specification, an electronic device may include a processor and an image sensor module. The image sensor module may include an image sensor in which one or more sensor pixels are arranged and a control circuit electrically connected to the image sensor and connected to the processor through an interface. The control circuit may be configured to obtain raw image data including pieces of image pixel data, in which one or more first pixel data corresponding to a first attribute and one or more second pixel data corresponding to a second attribute are arranged in a first array, using the image sensor, to identify rearrangement information, which is predetermined based on the first attribute and the second attribute and includes information for changing an array of the pieces of image pixel data, to change the array of the pieces of image pixel data into a second array based on the rearrangement information such that at least part of the one or more first pixel data is arranged adjacent and at least part of the one or more second pixel data is arranged adjacent, to generate compression data obtained by compressing the pieces of image pixel data whose array is changed into the second array, and to transmit the compression data to the processor. The processor may be configured to restore the raw image data, using the compression data.

Advantageous Effects

According to embodiments disclosed in the specification, the image data generated by an image sensor may be rearranged such that pieces of pixel data having the same attribute are adjacent to each other. In this way, the compression rate of the image data may be increased and transmission efficiency and storage efficiency may be increased. Furthermore, the image sensor may be different for each manufacturer. In this case, a method of rearranging the image data may be applied regardless of the image sensor, and thus may have high effectiveness. Besides, a variety of effects directly or indirectly understood through the disclosure may be provided.

DESCRIPTION OF DRAWINGS

With regard to description of drawings, similar components may be marked by similar reference numerals.

MODE FOR INVENTION

Figure 1:
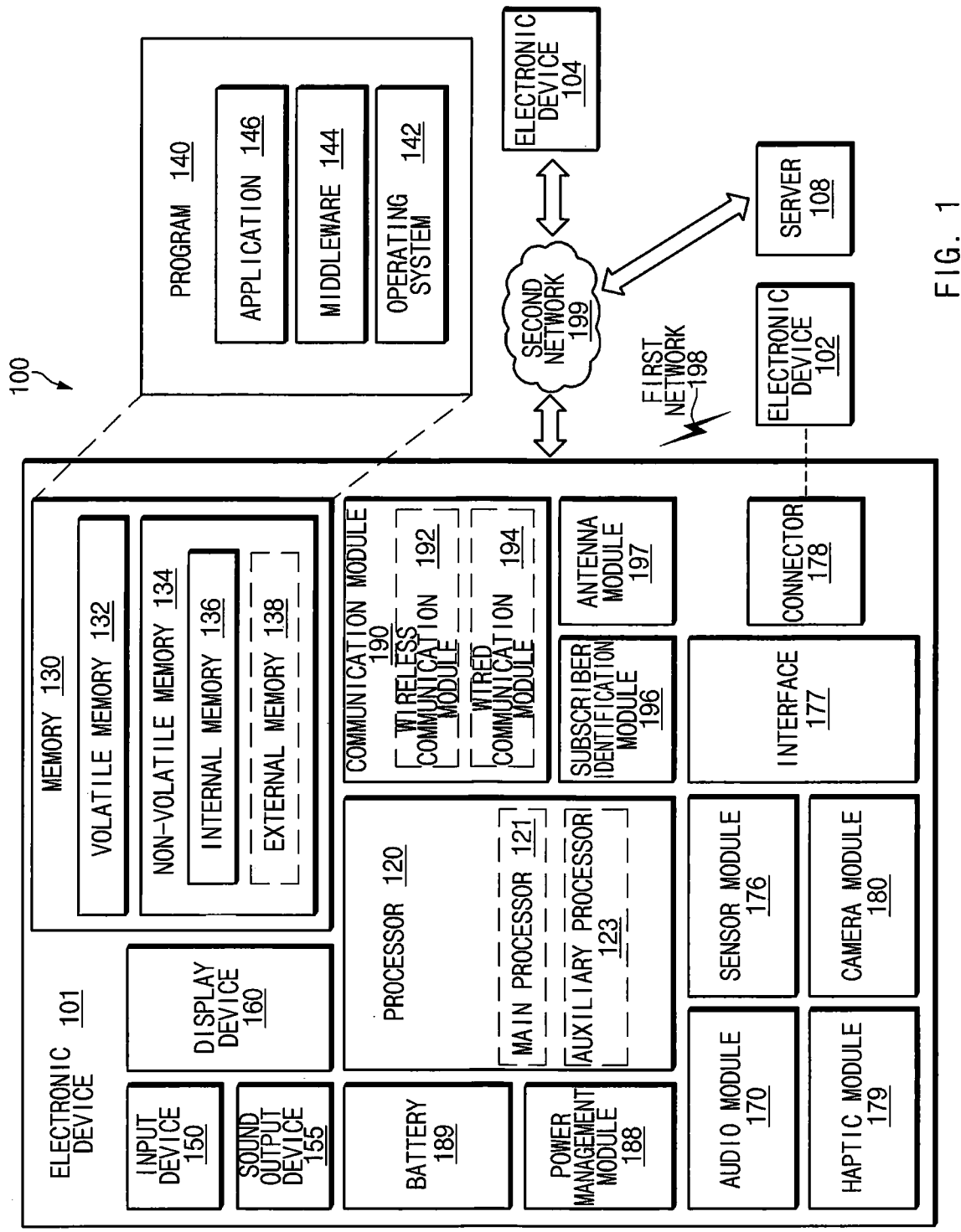
FIG. 1 is a block diagram of an electronic device for compressing an image based on an attribute of image data in a network environment, according to various embodiments.

FIG. 1 is a block diagram of an electronic device 101 for compressing an image based on the attribute of image data in a network environment 100 according to various embodiments. Referring to FIG. 1, the electronic device 101 may communicate with an electronic device 102 through a first network 198 (e.g., a short-range wireless communication) or may communicate with an electronic device 104 or a server 108 through a second network 199 (e.g., a long-distance wireless communication) in the network environment 100. According to an embodiment, the electronic device 101 may communicate with the electronic device 104 through the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. According to some embodiments, at least one (e.g., the display device 160 or the camera module 180) among components of the electronic device 101 may be omitted or other components may be added to the electronic device 101. According to some embodiments, some components may be integrated and implemented as in the case of the sensor module 176 (e.g., a fingerprint sensor, an iris sensor, or an illuminance sensor) embedded in the display device 160 (e.g., a display).

The processor 120 may operate, for example, software (e.g., a program 140) to control at least one of other components (e.g., a hardware or software component) of the electronic device 101 connected to the processor 120 and may process and compute a variety of data. The processor 120 may load a command set or data, which is received from other components (e.g., the sensor module 176 or the communication module 190), into a volatile memory 132, may process the loaded command or data, and may store result data into a nonvolatile memory 134. According to an embodiment, the processor 120 may include a main processor 121 (e.g., a central processing unit or an application processor) and an auxiliary processor 123 (e.g., a graphic processing device, an image signal processor, a sensor hub processor, or a communication processor), which operates independently from the main processor 121, additionally or alternatively uses less power than the main processor 121, or is specified to a designated function. In this case, the auxiliary processor 123 may operate separately from the main processor 121 or embedded.

In this case, the auxiliary processor 123 may control, for example, at least some of functions or states associated with at least one component (e.g., the display device 160, the sensor module 176, or the communication module 190) among the components of the electronic device 101 instead of the main processor 121 while the main processor 121 is in an inactive (e.g., sleep) state or together with the main processor 121 while the main processor 121 is in an active (e.g., an application execution) state. According to an embodiment, the auxiliary processor 123 (e.g., the image signal processor or the communication processor) may be implemented as a part of another component (e.g., the camera module 180 or the communication module 190) that is functionally related to the auxiliary processor 123. The memory 130 may store a variety of data used by at least one component (e.g., the processor 120 or the sensor module 176) of the electronic device 101, for example, software (e.g., the program 140) and input data or output data with respect to commands associated with the software. The memory 130 may include the volatile memory 132 or the nonvolatile memory 134.

The program 140 may be stored in the memory 130 as software and may include, for example, an operating system 142, a middleware 144, or an application 146.

The input device 150 may be a device for receiving a command or data, which is used for a component (e.g., the processor 120) of the electronic device 101, from an outside (e.g., a user) of the electronic device 101 and may include, for example, a microphone, a mouse, or a keyboard.

The sound output device 155 may be a device for outputting a sound signal to the outside of the electronic device 101 and may include, for example, a speaker used for general purposes, such as multimedia play or recordings play, and a receiver used only for receiving calls. According to an embodiment, the receiver and the speaker may be either integrally or separately implemented.

The display device 160 may be a device for visually presenting information to the user and may include, for example, a display, a hologram device, or a projector and a control circuit for controlling a corresponding device. According to an embodiment, the display device 160 may include a touch circuitry or a pressure sensor for measuring an intensity of pressure on the touch.

The audio module 170 may convert a sound and an electrical signal in dual directions. According to an embodiment, the audio module 170 may obtain the sound through the input device 150 or may output the sound through an external electronic device (e.g., the electronic device 102 (e.g., a speaker or a headphone)) wired or wirelessly connected to the sound output device 155 or the electronic device 101.

The sensor module 176 may generate an electrical signal or a data value corresponding to an operating state (e.g., power or temperature) inside or an environmental state outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support a designated protocol wired or wirelessly connected to the external electronic device (e.g., the electronic device 102). According to an embodiment, the interface 177 may include, for example, an HDMI (high-definition multimedia interface), a USB (universal serial bus) interface, an SD card interface, or an audio interface.

A connecting terminal 178 may include a connector that physically connects the electronic device 101 to the external electronic device (e.g., the electronic device 102), for example, an HDMI connector, a USB connector, an SD card connector, or an audio connector (e.g., a headphone connector).

The haptic module 179 may convert an electrical signal to a mechanical stimulation (e.g., vibration or movement) or an electrical stimulation perceived by the user through tactile or kinesthetic sensations. The haptic module 179 may include, for example, a motor, a piezoelectric element, or an electric stimulator.

The camera module 180 may shoot a still image or a video image. According to an embodiment, the camera module 180 may include, for example, at least one lens, an image sensor, an image signal processor, or a flash.

The power management module 188 may be a module for managing power supplied to the electronic device 101 and may serve as at least a part of a power management integrated circuit (PMIC).

The battery 189 may be a device for supplying power to at least one component of the electronic device 101 and may include, for example, a non-rechargeable (primary) battery, a rechargeable (secondary) battery, or a fuel cell.

The communication module 190 may establish a wired or wireless communication channel between the electronic device 101 and the external electronic device (e.g., the electronic device 102, the electronic device 104, or the server 108) and support communication execution through the established communication channel. The communication module 190 may include at least one communication processor operating independently from the processor 120 (e.g., the application processor) and supporting the wired communication or the wireless communication. According to an embodiment, the communication module 190 may include a wireless communication module 192 (e.g., a cellular communication module, a short-range wireless communication module, or a GNSS (global navigation satellite system) communication module) or a wired communication module 194 (e.g., an LAN (local area network) communication module or a power line communication module) and may communicate with the external electronic device using a corresponding communication module among them through the first network 198 (e.g., the short-range communication network such as a Bluetooth, a Wi-Fi direct, or an IrDA (infrared data association)) or the second network 199 (e.g., the long-distance wireless communication network such as a cellular network, an internet, or a computer network (e.g., LAN or WAN)). The above-mentioned various communication modules 190 may be implemented into one chip or into separate chips, respectively.

According to an embodiment, the wireless communication module 192 may identify and authenticate the electronic device 101 using user information stored in the subscriber identification module 196 in the communication network.

The antenna module 197 may include one or more antennas to transmit or receive the signal or power to or from an external source. According to an embodiment, the communication module 190 (e.g., the wireless communication module 192) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 101 and the external electronic device 104 through the server 108 connected to the second network 199. Each of the electronic devices 102 and 104 may be the same or different types as or from the electronic device 101. According to an embodiment, all or some of the operations performed by the electronic device 101 may be performed by another electronic device or a plurality of external electronic devices. When the electronic device 101 performs some functions or services automatically or by request, the electronic device 101 may request the external electronic device to perform at least some of the functions related to the functions or services, in addition to or instead of performing the functions or services by itself. The external electronic device receiving the request may carry out the requested function or the additional function and transmit the result to the electronic device 101. The electronic device 101 may provide the requested functions or services based on the received result as is or after additionally processing the received result. To this end, for example, a cloud computing, distributed computing, or client-server computing technology may be used.

Figure 2:
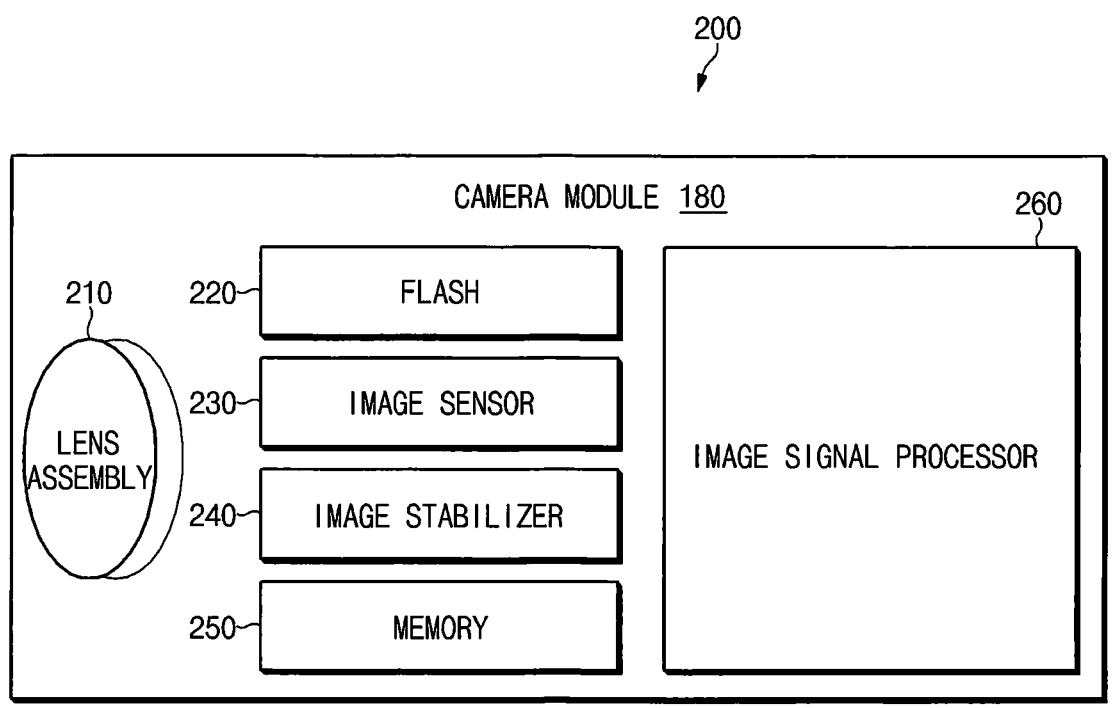
FIG. 2 is a block diagram of a camera module for compressing an image based on an attribute of image data, according to various embodiments.

FIG. 2 is a block diagram 200 of the camera module 180 for compressing an image based on an attribute of image data, according to various embodiments. Referring to FIG. 2, the camera module 180 may include a lens assembly 210, a flash 220, an image sensor 230, an image stabilizer 240, a memory 250 (e.g., a buffer memory), or an image signal processor 260. The lens assembly 210 may collect the light emitted from the subject to be captured. The lens assembly 210 may include one or more lenses. According to an embodiment, the camera module 180 may include the plurality of lens assemblies 210. In this case, the camera module 180 may be, for example, a dual camera, a 360-degree camera, or a spherical camera. The plurality of lens assemblies 210 may have the same lens attribute (e.g., a field of view, a focal length, an auto focus, f-number, or an optical zoom); alternatively, at least one lens assembly may have at least one attribute different from the lens attribute of another lens assembly. For example, the lens assembly 210 may include a wide-angle lens or a telephoto lens. The flash 220 may emit a light source used to enhance the light emitted from the subject. The flash 220 may include one or more light emitting diodes (e.g., a red-green-blue (RGB) LED, a white LED, an infrared LED, or an ultraviolet LED) or a xenon lamp.

The image sensor 230 may obtain an image corresponding to the subject by converting light, which is transmitted from the subject through the lens assembly 210, into an electrical signal. According to an embodiment, for example, the image sensor 230 may include a single image sensor, which is selected among image sensors having different attributes, such as an RGB sensor, a black and white (BW) sensor, an IR sensor, or a UV sensor, a plurality of image sensors having the same attribute, or a plurality of image sensors having different attributes. For example, each image sensor included in the image sensor 230 may be implemented with a charged coupled device (CCD) sensor or a complementary metal oxide semiconductor (CMOS) sensor.

For the purpose of at least partly compensating for the negative effects (e.g., the shaking of an image) by the movement on the captured image, the image stabilizer 240 may move at least one lens included in the lens assembly 210 or the image sensor 230 in a specific direction or may control (e.g., adjusting read-out timing, or the like) at least one lens or the image sensor 230, in response to the motion of the camera module 180 or the electronic device 101 including the camera module 180. According to an embodiment, the image stabilizer 240 may be implemented with, for example, an optical image stabilizer; the image stabilizer 240 may detect the movement, using a gyro sensor (not illustrated) or an acceleration sensor (not illustrated) disposed inside or outside the camera module 180.

The memory 250 may at least temporarily store at least part of the image obtained through the image sensor 230 for the next image processing task. For example, when image acquisition according to a shutter is delayed or when a plurality of images are obtained at high speed, the obtained original image (e.g., an image of high resolution) may be stored in the memory 250 and the copy image (e.g., an image of low resolution) corresponding to the obtained original image may be previewed through the display device 160. Afterward, when a specified condition is satisfied (e.g., a user input or a system command), at least part of the original image stored in the memory 250 may be obtained and processed by, for example, the image signal processor 260. According to an embodiment, the memory 250 may be implemented with at least part of the memory 130 or a separate memory operating independently of the memory 130.

The image signal processor 260 may perform image processing (e.g., the generation of a depth map, three-dimensional modeling, panorama generation, feature point extraction, image compositing, or image compensation (e.g., noise reduction, resolution adjustment, brightness adjustment, blurring, sharpening, or softening)) on the image obtained through the image sensor 230 or the image stored in the memory 250. Additionally or alternatively, the image signal processor 260 may control (e.g., exposure time control, or read-out timing control, or the like) of at least one (e.g., the image sensor 230) of the components included in the camera module 180. The image processed by the image signal processor 260 may be stored again in the memory 250 for further processing or may be transmitted to an external component of the camera module 180 (e.g., the memory 130, the display device 160, the electronic device 102, the electronic device 104, or the server 108). According to an embodiment, the image signal processor 260 may be implemented with at least part of the processor 120 or may be implemented with a separate processor operating independently of the processor 120. When the image signal processor 260 is implemented with a processor separate from the processor 120, the images processed by the image signal processor 260 may be displayed by the processor 120 through the display device 160 as it is or after further image processing.

According to an embodiment, the electronic device 101 may include two or more camera modules 180 having different attributes or functions. In this case, for example, the at least one the camera module 180 may be a wide-angle camera or a front camera; at least the other camera module may be a telephoto camera or a rear camera.

Figure 3:
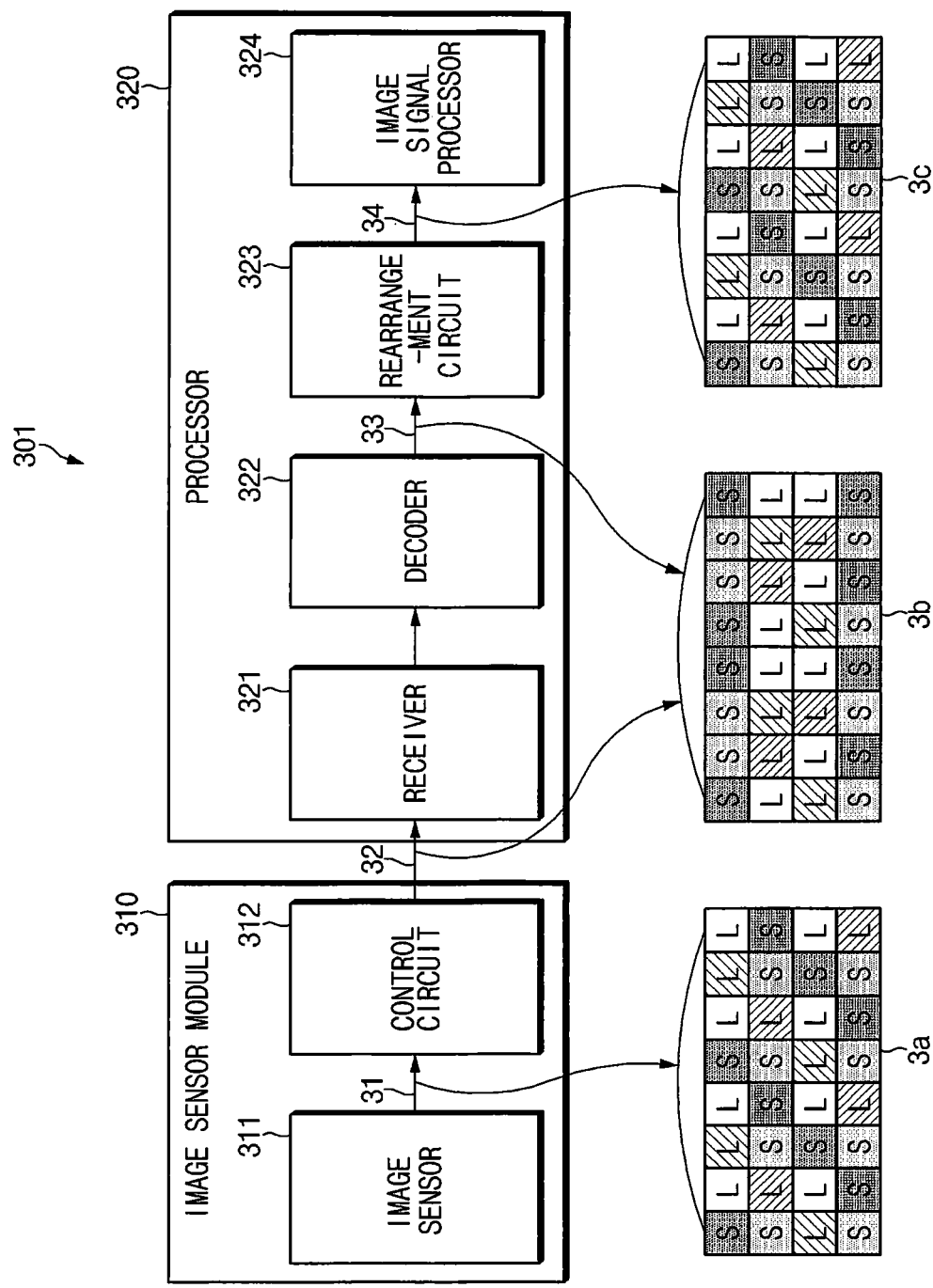
FIG. 3 is a block diagram of an electronic device for compressing an image based on an attribute of image data, according to an embodiment.

FIG. 3 is a block diagram of an electronic device for compressing an image based on an attribute of image data, according to an embodiment.

Referring to FIG. 3, an electronic device 301 (e.g., the electronic device 101 of FIG. 1) may include an image sensor module 310 and a processor 320 (e.g., the processor 120 and the image signal processor 260). According to various embodiments, the electronic device 301 may be implemented without some components or may be implemented to further include one or more components. For example, the electronic device 301 may further include a display, a memory, and/or a communication module.

The image sensor module 310 may shoot a still image or a video image. The image sensor module 310 may include an image sensor 311 (e.g., the image sensor 230) and a control circuit 312. According to various embodiments, the image sensor module 310 may be implemented without some components or may be implemented to further include one or more components. For example, the image sensor module 310 may further include a lens, an aperture, an infrared cut filter, and/or an optical image stabilization (OIS) driving module.

The processor 320 may include a receiver 321, a decoder 322, a rearrangement circuit 323, and an image signal processor (ISP) 324. According to an embodiment, the processor 320 may operate the overall function of the electronic device 301. For example, the processor 320 may process image data obtained from the image sensor module 310; the processor 320 may control the display included in the electronic device 301 such that the still image or the video of a subject is displayed using the processed image data. For another example, the processor 320 may store the processed image data in the memory of the electronic device 301. For still another example, the processor 320 may control a communication module included in the electronic device 301 such that the processed image data is transmitted to another electronic device or server.

According to an embodiment, the image sensor module 310 (e.g., the control circuit 312) and the processor 320 may be connected via an interface. For example, the image sensor module 310 may deliver image data to the processor 320, using the D-PHY and/or C-PHY scheme of mobile industry processor interface (MIPI).

According to an embodiment, the image sensor 311 may generate raw image data. The image sensor 311 may generate the image data corresponding to the light, which is reflected from a subject or generated by the subject. The image sensor 311 may include a pixel array in which a plurality of unit pixels (or referred to as "sensor pixels") are two-dimensionally arranged. The pixel array may include hundreds to tens of millions of unit pixels. For example, the image sensor 311 may be implemented using charge-coupled device (CCD) or complementary metal-oxide-semiconductor (CMOS). The image sensor 311 may generate an electrical signal (e.g., current) that is the basis of the image data, in response to the received light. The raw image data generated by the image sensor 311 may be delivered to the processor 320 through the control circuit 312.

According to an embodiment, the raw image data may be composed of pieces of pixel data (or a pixel value). The pieces of pixel data may be gathered by the specified number to constitute sub image data (or image pixel data). The sub image data may be gathered by the specified number to constitute raw image data. Accordingly, in this specification, it may be understood that an operation of processing the sub image data is an operation of processing the raw image data. For example, the sub image data may be a set in which sixteen pieces of pixel data is in a 4×4 array. In an embodiment, the pieces of sub image data may be repeatedly arranged to constitute raw image data forming the array of n×m. In this specification, the array formed by the sub image data may be referred to as a "first array".

According to an embodiment, the pixel may be categorized into at least one or more attributes. For example, the pixel may be categorized into the color of the detectable light, and the color of the light may correspond to the attribute. For still another example, the pixel may be categorized as the attributes of long exposure and short exposure, depending on the exposure level for light. The exposure to light may be specified by the size of an aperture, shutter speed, and the sensitivity to light. The long exposure may be specified as indicating an exposure value greater than the short exposure for light. In an embodiment, as the pixel is categorized by the at least one or more attributes, the pixel data may also be categorized by the at least one or more attributes.

In an embodiment, one or more first pixels having a first attribute and one or more second pixels having a second attribute may be disposed in the image sensor. Accordingly, one or more first pixel data corresponding to the first attribute and one or more second pixel data corresponding to the second attribute may be disposed in the first array to constitute sub image data.

According to an embodiment, the pieces of pixel data generated from pixels having the same attribute may have different attributes. For example, the exposure values of light in pixels having the same attribute may be controlled separately, and each of the generated pieces of pixel data may have different exposure values due to external factors. In other words, the pieces of pixel data may have different attributes by external factors, and the pieces of pixel data may be categorized into at least one or more attributes.

According to an embodiment, the control circuit 312 may obtain raw image data generated by the image sensor 311 and may perform a series of operations for processing the obtained raw image data. For example, the control circuit 312 may identify rearrangement information including information for changing the arrangement of the sub image data. The rearrangement information may be designated based on the attribute in advance. For another example, the control circuit 312 may change the array of the sub image data into a second array such that at least part of the pixel data among the pixel data is arranged adjacent to each other based on the rearrangement information. For still another example, the control circuit 312 may generate the compression data obtained by compressing the rearranged sub image data. The control circuit 312 may transmit the compression data to the processor 320.

According to an embodiment, the receiver 321 may receive compression data transmitted from the image sensor module 310 (or the control circuit 312). For example, the receiver 321 may receive the compression data through an interface (e.g., MIPI) connected to the transmitter included in the control circuit 312.

According to an embodiment, the decoder 322 may restore the compressed raw image data received from the receiver 321. According to various embodiments, the decoder 322 may be a separate module or may be included in the ISP 324.

According to an embodiment, the operation in which the decoder 322 restores the raw image data using the compression data may include an operation in which the rearrangement circuit changes the array of the sub image data from the second array to the first array based on the rearrangement information.

According to an embodiment, the ISP 324 may process the restored raw image data in a specified manner. The ISP 324 may include at least one image processing (IP) block configured to process the restored raw image data. For example, at least one IP block may include an IP block for color interpolation, an IP block for lens shading correction, an IP block for auto white balance, an IP block for lateral chromatic aberration correction, an IP block for optical inverse correction, an IP block for noise reduction, an IP block for edge enhancement, an IP block for gamma correction, or an IP block for out of focusing or blurring. According to various embodiments, the ISP 324 may be included in the processor 320 or may be implemented with a dedicated chip.

Referring to FIG. 3, in each step, the array type of image data is illustrated. In FIG. 3, the box displayed as subscript 'S' may be pixel data corresponding to short exposure, and the box displayed as subscript 'L' may be pixel data corresponding to long exposure.

Referring to an array type 3a, pixel data having a long exposure attribute and pixel data having a short exposure attribute may be mixed in the image data included in a signal 31, which is generated by the image sensor 311 and is transmitted to the control circuit 312. The image data arranged in the array type 3a may be compressed at a low compression rate because the similarity between the data of adjacent pixels is low and thus the transmission efficiency may be bad.

Referring to an array type 3b, the array of the image data included in a signal 32 transmitted from the control circuit 312 to the receiver 321 and a signal 33 transmitted from the decoder 322 to the rearrangement circuit 323 may be changed from the array type 3a. In the image data arranged in the array type 3b, the pixel data having the same attribute may be arranged adjacent depending on each attribute. The image data arranged in the array type 3b may be compressed at a high compression rate because the similarity between the data of adjacent pixels is high and thus may have good transmission efficiency.

Referring to an array type 3c, the array of the image data included in a signal 34 transmitted from the rearrangement circuit 323 to the ISP 324 of the processor 320 may be changed from the array type 3b. The image data arranged in the array type 3c may be the same as the array type 3a of the image data first generated by the image sensor.

The electronic device 301 may improve the compression rate of the raw image data through the rearrangement process and may increase the transmission efficiency of the electronic device 301.

Figure 4:
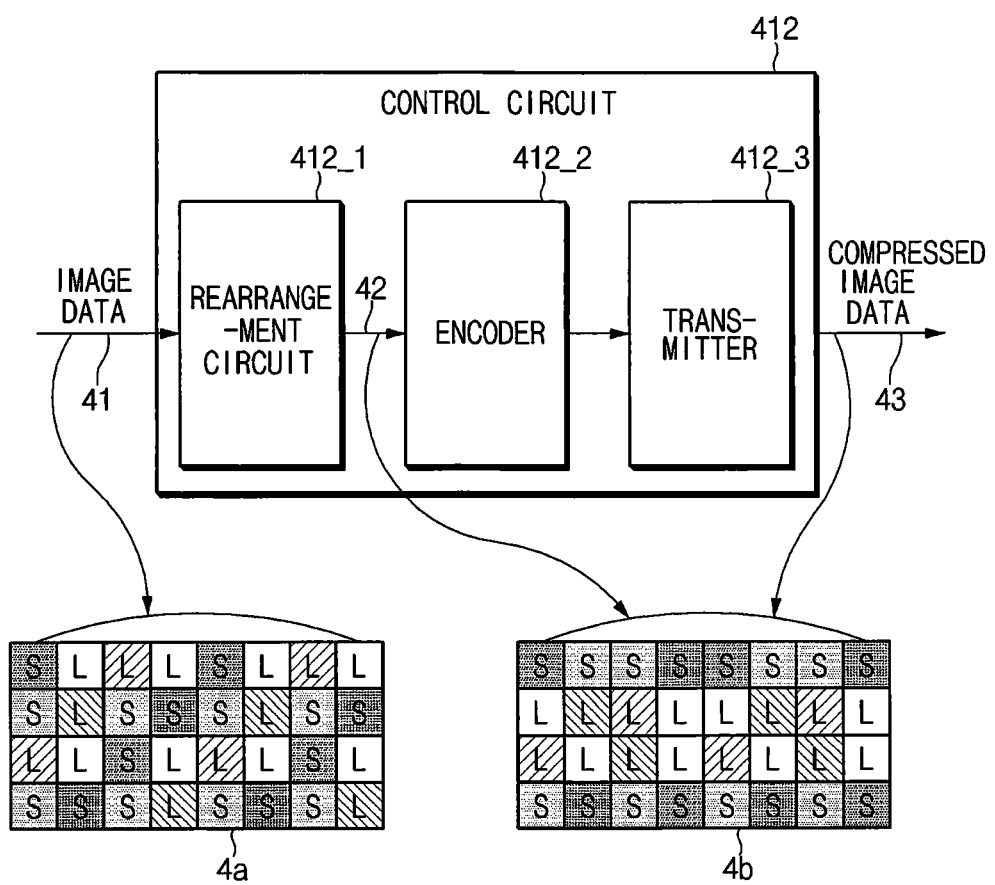
FIG. 4 is a block diagram of a control circuit for compressing an image based on an attribute of image data, according to an embodiment.

FIG. 4 is a block diagram of a control circuit for compressing an image based on an attribute of image data, according to an embodiment.

Referring to FIG. 4, a control circuit 412 may include components that perform the function of the control circuit 312 described in FIG. 3. The control circuit 412 may include a rearrangement circuit 412_1, an encoder 412_2, and a transmitter 412_3.

According to an embodiment, the rearrangement circuit 412_1 may be disposed in front of the encoder 412_2 so as to change the array of raw image data arranged in the first array obtained from the image sensor (e.g., the image sensor 311) into a second array. According to an embodiment, the rearrangement circuit 412_1 may change the array of the sub image data into the second array based on rearrangement information. The rearrangement information may be specified in advance based on the type of the first array and/or the second array.

According to an embodiment, an operation in which the rearrangement circuit 412_1 changes the array of the sub image data from the first array to the second array based on the rearrangement information may include an operation in which the rearrangement circuit 412_1 exchanges the pixel data of pixels included in the image sensor with each other in a specified scheme. In this case, the rearrangement information may include index information of counterpart pixels configured such that the pixel data is exchanged for each of the pixels. The detailed description thereof will be described with reference to FIG. 7.

According to an embodiment, each of the first array and the second array may include at least one or more rows (or lines). For example, when each of the first array and the second array is in the array of 4×4, each of the first array and the second array may include four rows. In an embodiment, the rearrangement circuit 412_1 may change the array of the sub image data from the first array to the second array such that pieces of pixel data corresponding to the same attribute are arranged adjacent to each other for the respective at least one or more rows.

According to an embodiment, the control circuit 412 may further include a line buffer. In this case, the rearrangement circuit 412_1 may change the array such that pieces of pixel data corresponding to the same attribute are arranged adjacent to each other for the respective at least one or more rows, using the line buffer. The detailed description thereof will be described with reference to FIG. 8.

According to embodiments, the rearrangement circuit 412_1 may be a separate module from the encoder 412_2 or may be included in the encoder 412_2.

According to an embodiment, the encoder 412_2 may encode raw image data of which the array is changed from the first array to the second array. The raw image data may be compressed through the encoding process. Accordingly, in this specification, it may be understood that encoding the image data is the same as compressing the image data.

According to an embodiment, the transmitter 412_3 may transmit the compressed raw image data to a receiver (e.g., the receiver 321) included in a processor (e.g., the processor 320 of FIG. 3). For example, the transmitter 412_3 may transmit the compressed raw image data, using a MIPI D-PHY and/or C-PHY scheme.

Referring to FIG. 4, in each step, the array type of image data is illustrated.

Referring to an array type 4a, pixel data having a long exposure attribute and pixel data having a short exposure attribute may be mixed in the image data included in a signal 41, which is input to the rearrangement circuit 412_1. The image data arranged in the array type 4a may be compressed at a low compression rate because the similarity between the data of adjacent pixels is low and thus the transmission efficiency may be bad.

Referring to an array type 4b, the array of the image data included in a signal 42 transmitted from the rearrangement circuit 412_1 to the encoder 412_2 and a signal 43 output from the transmitter 412_3 may be changed from the array type 4a. In the image data arranged in the array type 4b, the pixel data having the same attribute may be arranged adjacent depending on each attribute. The image data arranged in the array type 4b may be compressed at a high compression rate because the similarity between the data of adjacent pixels is high and thus may have good transmission efficiency.

Figure 5A:
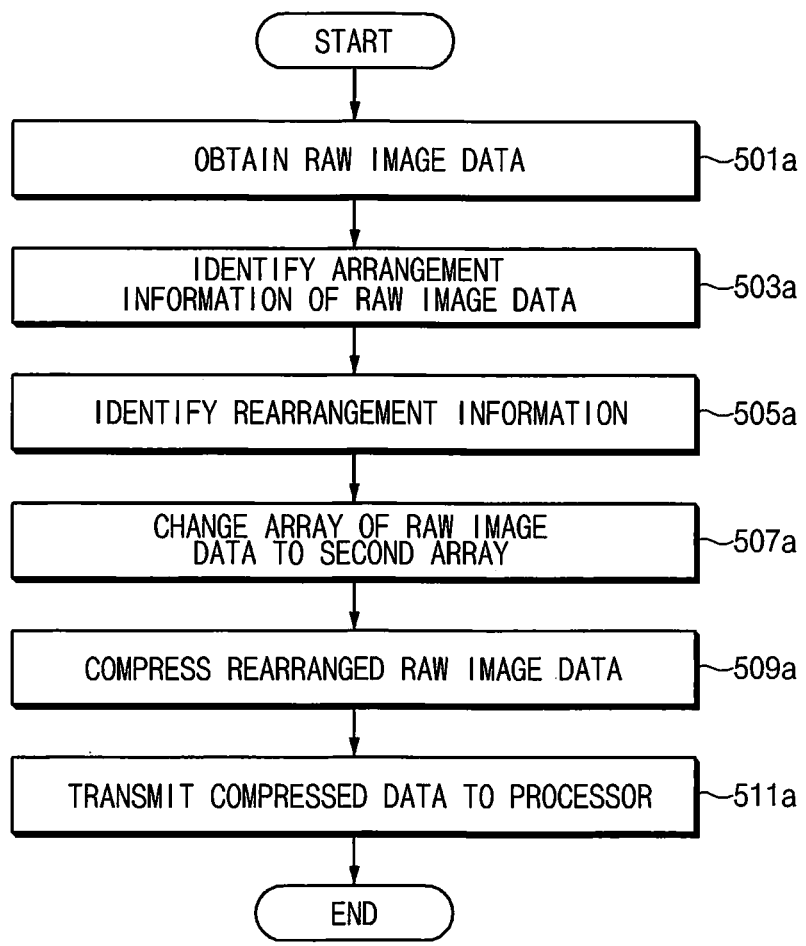
FIG. 5A is a flowchart indicating that an image sensor module transmits image data to a processor, according to an embodiment.
Figure 5B:
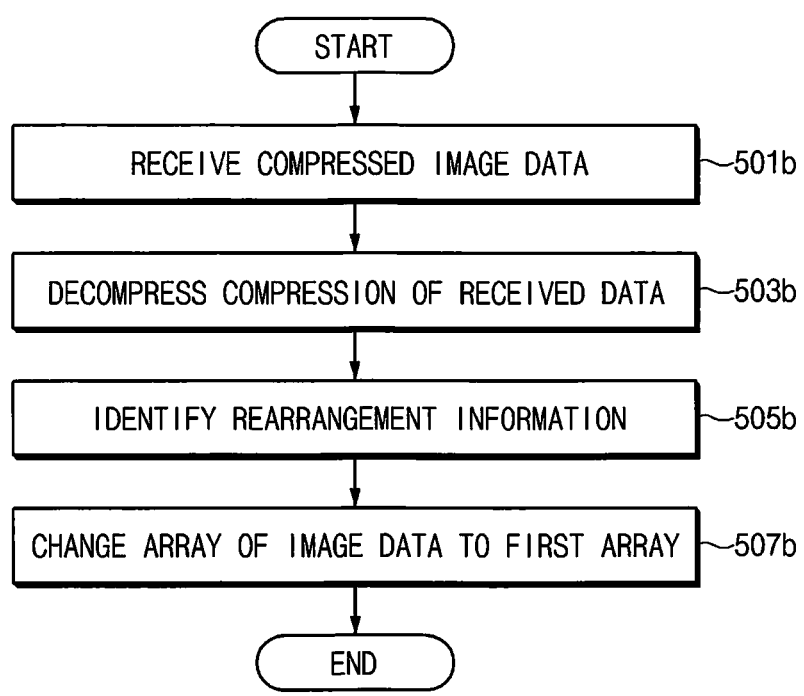
FIG. 5B is a flowchart indicating that a processor processes image data, according to an embodiment.

FIGS. 5A and 5B illustrate flowcharts of transmitting and processing image data by an electronic device, according to an embodiment.

Referring to FIG. 5A, an operation in which an image sensor module according to an embodiment transmits image data to a processor may include operation 501a to operation 511a.

In operation 501a, image sensor module (e.g., the image sensor module 310 or the control circuit 312) may obtain raw image data corresponding to the light reflected from a subject or the light generated by the subject, using an image sensor. The raw image data may consist of the repetitive batch of pieces of sub image data; each pixel data included in the sub image data may have an electrical value corresponding to the light.

In operation 503a, an image sensor module (e.g., the image sensor module 310 and the control circuit 312) may identify arrangement information (e.g., the first array) of the sub image data. The arrangement information may be different for each manufacturer of the image sensor. The operation 503a may be omitted. For example, when the image sensor module uses a specified image sensor, an operation of identifying the arrangement information may be omitted.

In operation 505a, the image sensor module (e.g., the image sensor module 310 and the control circuit 312) may identify the rearrangement information corresponding to the arrangement information. The rearrangement information may vary based on the arrangement information identified by the image sensor module in operation 503a. For example, when the first array of the image sensor has a bayer pattern and when the first array of the image sensor has a red-green-blue-emerald (RGBE) pattern, the rearrangement information may be different from each other.

In operation 507a, the image sensor module (e.g., the image sensor module 310 and the control circuit 312) may change the array of the sub image data from the first array to the second array based on the rearrangement information. Operation 507a may be performed depending on various predetermined algorithms. The raw image data may include pieces of sub image data, and thus the array of the raw image data may be rearranged when the sub image data is rearranged by operation 507a. In operation 507a, the image sensor module may store the rearranged raw image data in a memory; alternatively, the image sensor module may divides the raw image data into each of rows to rearrange the raw image data sequentially and may input the raw image data to the encoder for operation 509a at the same time.

In operation 509a, the image sensor module (e.g., the image sensor module 310 and the control circuit 312) may encode (or compress) the raw image data including the sub image data rearranged in the second array.

In operation 511a, the image sensor module (e.g., the image sensor module 310 and the control circuit 312) may transmit the compressed data to a processor. The transmission of the data may be made by an interface (e.g., MIPI) connecting the image sensor module to the processor.

Referring to FIG. 5B, an operation in which a processor according to an embodiment processes an image data may include operation 501b to operation 507b.

In operation 501b, the processor (e.g., the processor 320) may receive compression data transmitted by an image sensor module. In an embodiment, the processor may receive rearrangement information about image data separately from the compression data.

In operation 503b, the processor (e.g., the processor 320) may decompress the compression of data, which is compressed and then transmitted. It may be understood that an operation of decompressing the compression of the data is the same as an operation of decoding the data.

In operation 505b, the processor (e.g., the processor 320) may identify the rearrangement information about the transmitted compression data. For example, the rearrangement information may correspond to index information of counterpart pixel data exchanged for each pixel data.

In operation 507b, the processor (e.g., the processor 320) may restore the array of the raw image data decompressed in operation 503b to the form first obtained by the image sensor module. Contrary to the operation performed in operation 507a illustrated in FIG. 5A, the processor may change the array of sub image data included in the raw image data from the second array to the first array based on the rearrangement information.

Through the operations, the electronic device may perform an operation of transmitting and processing image data.

Figure 6:
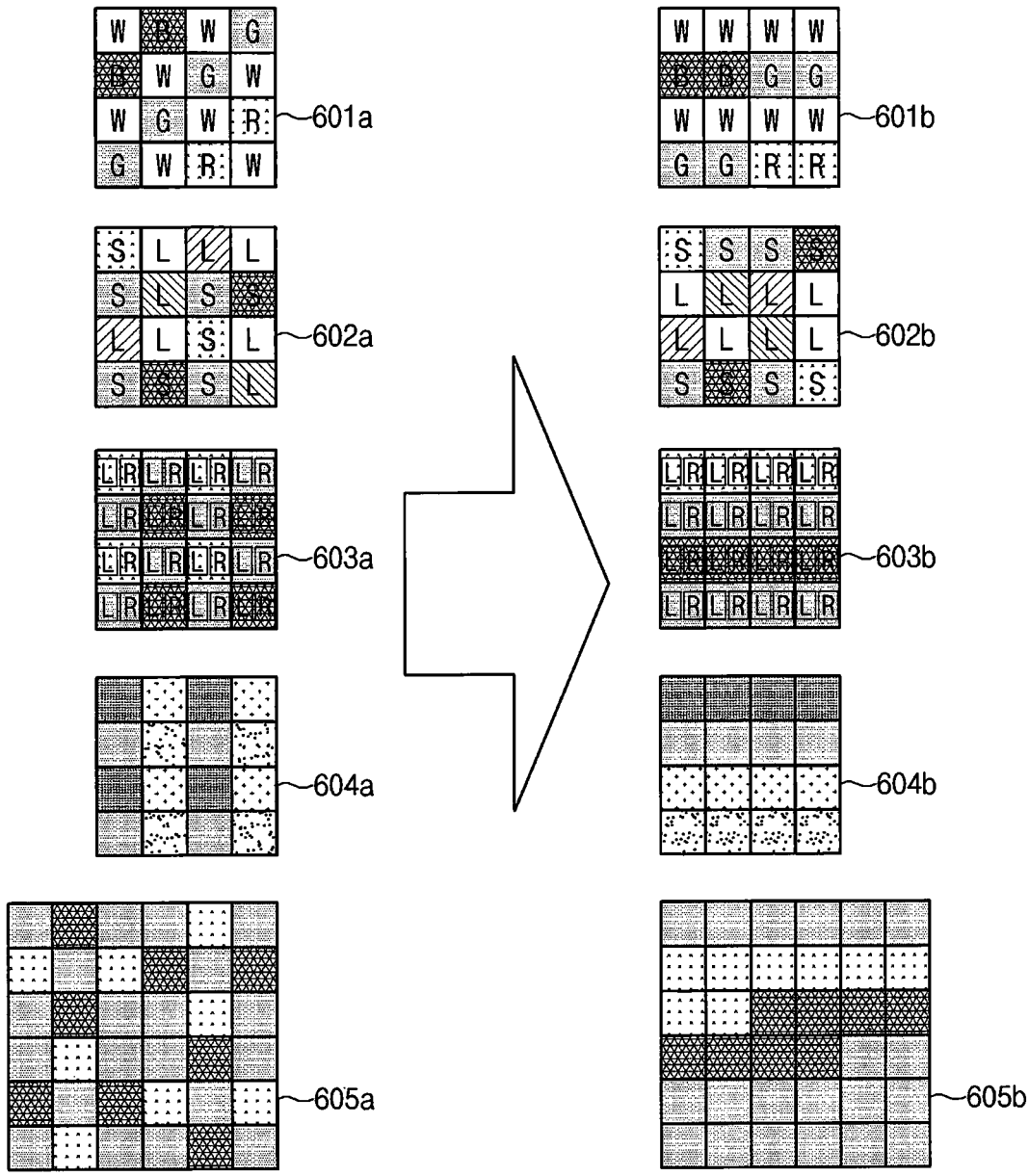
FIG. 6 is a diagram for describing that sub image data is rearranged, according to various embodiments.

FIG. 6 is a diagram for describing that sub image data is rearranged, according to various embodiments.

Referring to FIG. 6, the pixel arrangement of the various image sensors is illustrated. The image sensor may have various pixel arrangements depending on a manufacturer. Each pixel arrangement illustrated in FIG. 6 may be referred to as a macro block of each image sensor.

In various embodiments, the macro blocks may correspond to a unit array constituting each image sensor. Each of the macro blocks may consist of the array of a plurality of pixels (or sensor pixels). The macro block may include a bayer pattern, a red-green-blue-emerald (RGBE) pattern, a cyan-yellow-yellow-magenta (CYYM) pattern, a cyan-yellow-green-magenta (CYGM) pattern, a red-green-blue-white (RGBW) pattern, and an X-trans pattern.

In an embodiment, the macro block may additionally have the attributes of long exposure and short exposure depending on the exposure level for the light of a pixel. The long exposure may be specified as indicating an exposure value greater than the short exposure for light. In an embodiment, when the attribute according to the exposure level is added to the bayer pattern, the macro block of the image sensor may have the same array as the macro block 602a.

In another embodiment, each pixel in the macro block may include a first photo detector and a second photo detector and may additionally have the attribute for the photo detector. For example, when the attribute of the photo detector is added to the bayer pattern, the macro block of the image sensor may have the same array as the macro block 603a.

According to an embodiment, it may be understood that FIG. 6 illustrates the result of sensing light in each pixel included in the image sensor, so-called, the attribute of the pixel data. In other words, with respect to sub image data including pieces of pixel data, it may be understood that the attribute of each pixel data is indicated in an array type.

In FIG. 6, the drawing that is displayed as subscript 'a' and displayed on the left side may indicate sub image data included in the raw image data detected by the image sensor. The drawing that is displayed as subscript 'b' and displayed on the right side may indicate sub image data of which the array is changed into the second array such that at least part of one or more pixel data is arranged adjacent thereto.

According to an embodiment, the array type of the sub image data 601a may be an RGBW pattern. The array of the sub image data 601a may be the array of 4×4 and may be composed of two pieces of pixel data having a red attribute, four pieces of pixel data having a green attribute, two pieces of pixel data having a blue attribute, and eight pieces of pixel data having a white attribute.

In an embodiment, the rearrangement circuit (e.g., 412_1 of FIG. 4) may change the array of the sub image data 601a into the second array such that at least part of the pixel data (e.g., the pixel data having red attribute) having the same attribute (e.g., red attribute) among pieces of pixel data having each attribute is arranged adjacent thereto. The sub image data 601b of which the array is changed into the second array is illustrated on the right side.

According to another embodiment, the array type of the sub image data 602a may be a bayer pattern to which the attribute according to the exposure level is added. The array of the sub image data 602a may be the array of 4×4 and may be composed of two pieces of pixel data that is long exposure and has a red attribute, two pieces of pixel data that is short exposure and has a red attribute, four pieces of pixel data that is long exposure and has a green attribute, four pieces of pixel data that is short exposure and has a green attribute, two pieces of pixel data that is long exposure and has a blue attribute, and two pieces of pixel data that is short exposure and has a blue attribute.

In an embodiment, the rearrangement circuit may change the array of the sub image data 602a into the second array such that at least part of the pixel data (e.g., the pixel data having long exposure) having the same attribute (e.g., long exposure) among pieces of pixel data having each attribute is arranged adjacent thereto. For example, the array may be changed such that pieces of pixel data having a long exposure attribute are adjacent to each other and pieces of pixel data having a short exposure attribute are adjacent to each other. The sub image data 602b of which the array is changed into the second array is illustrated on the right side. In an embodiment, it may also be possible to change the array such that pieces of pixel data having both the same attribute according to the exposure level and the same attribute according to a color are adjacent to each other.

According to another embodiment, the array type of the sub image data 603a may be a bayer pattern to which the attribute according to the photo detector is added. The array of the sub image data 603a may be the array of 4×4 and may be composed of four pieces of pixel data having a red attribute, eight pieces of pixel data having a green attribute, and four pieces of pixel data having a blue attribute. Each pixel data includes a first photo detector and a second photo detector.

In an embodiment, the rearrangement circuit may change the array of the sub image data 603a into the second array such that at least part of the pixel data (e.g., the pixel data having a red attribute) having the same attribute (e.g., red attribute) among pieces of pixel data having each attribute is arranged adjacent thereto. The sub image data 603b of which the array is changed into the second array is illustrated on the right side. In an embodiment, it may also be possible to change the array such that pieces of pixel data having both the same attribute according to the photo detector and the same attribute according to a color are adjacent to each other.

According to another embodiment, the array type of the sub image data 604a may be a CYGM pattern. The array of the sub image data 604a may be the array of 4×4 and may be composed of four pieces of pixel data having a cyan attribute, four pieces of pixel data having a yellow attribute, four pieces of pixel data having a green attribute, and four pieces of pixel data having a magenta attribute.

In an embodiment, the rearrangement circuit may change the array of the sub image data 604a into the second array such that at least part of the pixel data (e.g., the pixel data having a cyan attribute) having the same attribute (e.g., cyan attribute) among pieces of pixel data having each attribute is arranged adjacent thereto. The sub image data 604b of which the array is changed into the second array is illustrated on the right side.

According to another embodiment, the array type of the sub image data 605a may be an X-tans pattern. The array of the sub image data 605a may be the array of 6×6 and may be composed of eight pieces of pixel data having a red attribute, twenty pieces of pixel data having a green attribute, and eight pieces of pixel data having a blue attribute.

In an embodiment, the rearrangement circuit may change the array of the sub image data 605a into the second array such that at least part of the pixel data (e.g., the pixel data having a green attribute) having the same attribute (e.g., green attribute) among pieces of pixel data having each attribute is arranged adjacent thereto. The sub image data 605*b* of which the array is changed into the second array is illustrated on the right side. In an embodiment, it may be possible to change the array such that all twenty pieces of pixel data having a green attribute are adjacent to each other.

Figure 7:
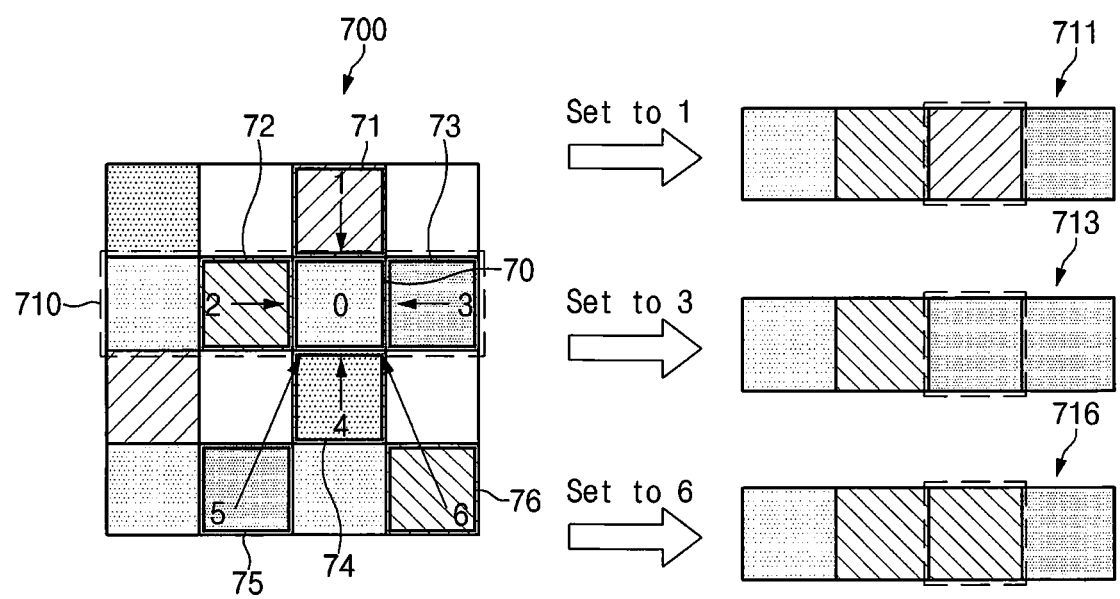
FIG. 7 illustrates a method in which an electronic device changes an array of image data, according to an embodiment.

FIG. 7 illustrates a method in which an electronic device changes an array of image data, according to an embodiment.

Referring to FIG. 7, sub image data 700 generated by an image sensor is illustrated. In an embodiment, the sub image data 700 forms the array of 4×4 and each pixel data constituting the array may be arranged regardless of an attribute. In other words, because the type of the sub image data 700 is in a state before the array is yet changed to the second array, the type of the sub image data 700 may correspond to the first array. The sub image data 700 may include four rows, and one row 710 thereof may include four pieces of pixel data.

According to an embodiment, the rearrangement circuit (e.g., the rearrangement circuit 412_1 of FIG. 4) may change the array of the sub image data 700 from the first array to the second array based on the rearrangement information. In an embodiment, an operation in which the rearrangement circuit changes the array may include an operation in which the rearrangement circuit exchanges pieces of pixel data of pixels included in an image sensor with each other in a specified scheme. In this case, the rearrangement information may include index information of counterpart pixels configured such that the pixel data is exchanged for each of the pixels.

For example, the rearrangement circuit may exchange first pixel data 70 disposed in the first row 710 of the sub image data 700 with adjacent pixel data (e.g., 71 to 76). In this case, each adjacent pixel data may have specified index information. For example, second pixel data 71 positioned above the first pixel data 70 may have "1" as index information; third pixel data 72 positioned to the left of the first pixel data 70 may have "2" as index information.

According to an embodiment, when the first pixel data 70 is exchanged with other pixel data, for example, the pixel data 71 with "1" as index information, the first pixel data 70 is exchanged with the second pixel data 71 and the rearrangement information may include "1" as index information with respect to the first pixel data 70. In this case, the data of the first row 710 may be changed to the data of a first row 711.

For another example, when the first pixel data 70 is exchanged with pixel data 73 having "3" as index information, the first pixel data 70 is exchanged with the fourth pixel data 73 and the rearrangement information may include "3" as index information with respect to the first pixel data 70. In this case, the data of the first row 710 may be changed to the data of a first row 713.

For still another example, when the first pixel data 70 is exchanged with pixel data 76 having "6" as index information, the first pixel data 70 is exchanged with fifth pixel data 76 and the rearrangement information may include "6" as index information with respect to the first pixel data 70. In this case, the data of the first row 710 may be changed to the data of a first row 716.

According to an embodiment, as the process is repeated, index information of the pixel data exchanged for each pixel may be accumulated and may be included in the rearrangement information. In an embodiment, when the processor changes the array of image data, which is transmitted from the image sensor module, from the second array to the first array, the processor may change the array of the image data based on the accumulated rearrangement information.

Figure 8:
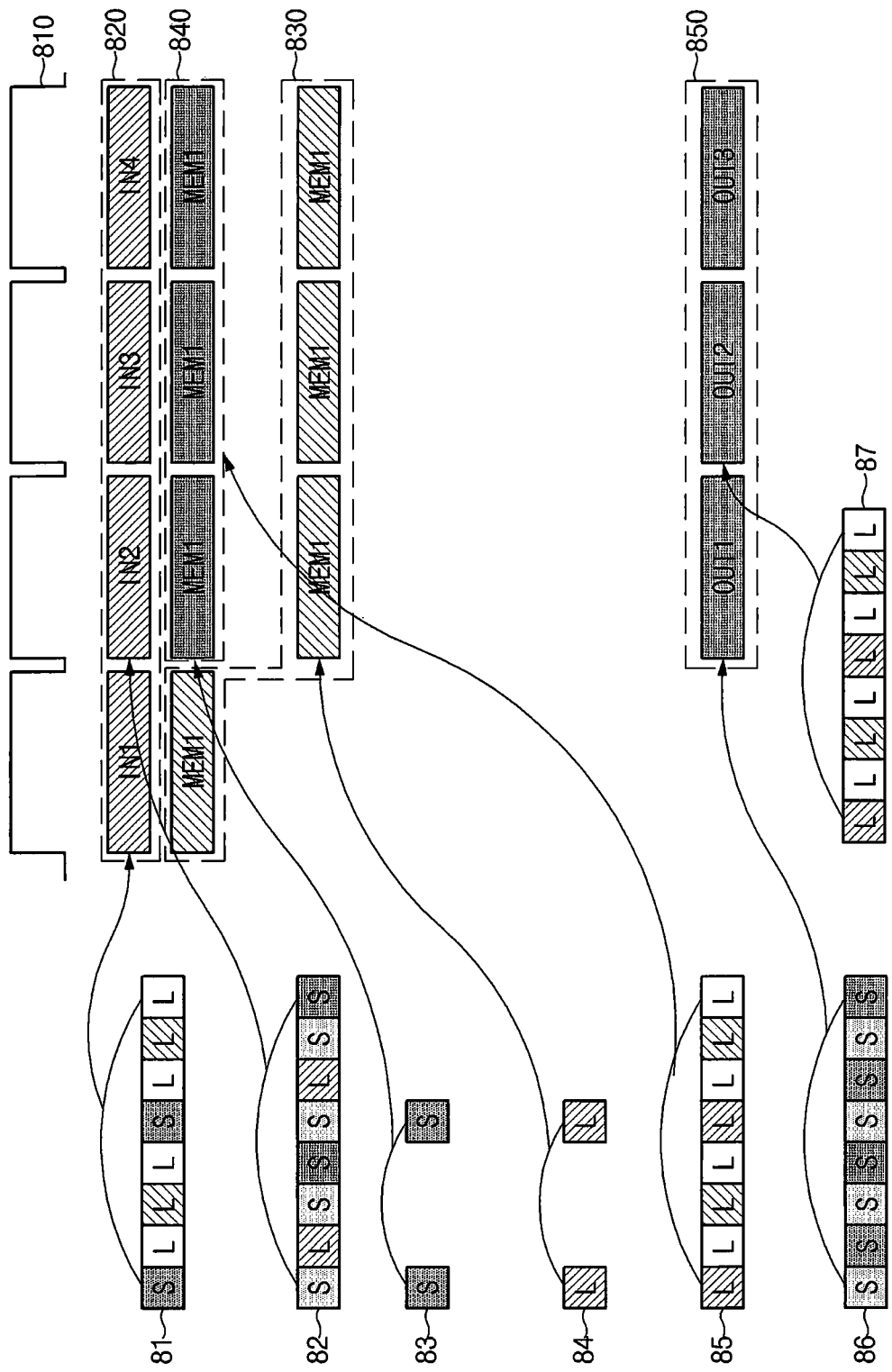
FIG. 8 illustrates a method in which an electronic device changes an array of image data by using a line buffer, according to an embodiment.

FIG. 8 illustrates a method in which an electronic device changes an array of image data by using a line buffer, according to an embodiment.

Referring to FIG. 8, the timing chart of input data, output data, and a memory for the case where the rearrangement circuit (e.g., the rearrangement circuit 412_1 of FIG. 4) changes the array of the image data is illustrated. The electronic device may include a line buffer as the memory. In an embodiment, the attribute of the image data may be color and the exposure level for light. In FIG. 8, the box displayed as subscript 'S' may be pixel data corresponding to short exposure, and the box displayed as subscript 'L' may be pixel data corresponding to long exposure.

Referring to the timing chart, as a clock signal 810 is changed, an input signal 820, data 830 to be written in the memory, data 840 to be read from the memory, and an output signal 850 may vary.

According to an embodiment, in the first period of the clock signal 810, a first line 81 of image data may be the input signal 820. The electronic device may write the data 81 of the entered first line into the memory.

According to an embodiment, in the second period of the clock signal 810, a second line 82 of image data may be the input signal 820. In an embodiment, the electronic device may read data 83 having the attribute of short exposure among data of the first line 81 written in the memory. In the second line 82 that is the input signal 820, the data having the attribute of short exposure may form the output signal 850 at once without being entered into the memory. The data 84, which is the input signal 820 and has the attribute of long exposure in the second line 82, may be written into the memory together with data having the attribute of long exposure in the first line 81 reserved in the memory. According to the process, the data 85 composed of only the pixel data having the attribute of long exposure may be written to the memory; the data 86 composed of only the pixel data having the attribute of short exposure may constitute the output signal 850.

According to an embodiment, in the third period of the clock signal 810, the third line (not illustrated) of image data may be the input signal 820. In an embodiment, the electronic device may read the data 85 composed of only the pixel data having the attribute of long exposure written in the memory. The electronic device may write the entered data of the third line in the memory. The output signal 850 may be the data 87 composed of only the pixel data having the attribute of long exposure read from the memory.

According to the process, the rearrangement process of the image data performed in the rearrangement circuit may be implemented with only one line buffer, not the memory (e.g., DRAM) of a large capacity.

Figure 9:
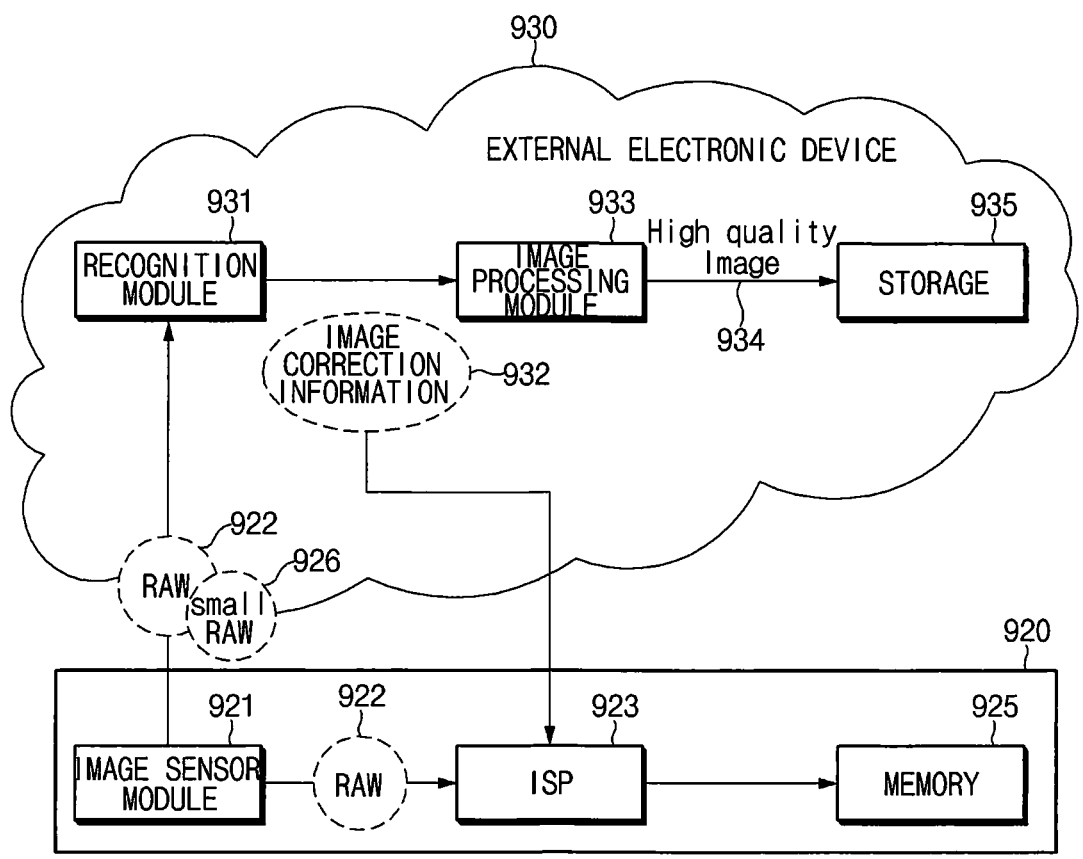
FIG. 9 is a block diagram for describing operations of an electronic device and an external electronic device, according to various embodiments.

FIG. 9 is a block diagram for describing operations of an electronic device and an external electronic device, according to various embodiments.

Referring to FIG. 9, an electronic device 920 (e.g., the electronic device 101) may include an image sensor module 921 (e.g., the image sensor module 310), an ISP 923 (e.g., the processor 301), and a memory 925. An external electronic device 930 (e.g., the electronic device 102, the electronic device 104, or the server 108) may include a recognition module 931, an image processing module 933, and storage 935. The recognition module 931 may be a logical module, and may be implemented with the processor of the external electronic device 930. The image processing module 933 may be implemented with the processor of the external electronic device 930. For example, the processor of the external electronic device 930 may perform both recognition and image processing. Although not illustrated in FIG. 9, the electronic device 920 may include a communication module (e.g., the interface 177 or the communication module 190) capable of transmitting and receiving data to and from the external electronic device 930. The external electronic device 930 may include a communication module capable of transmitting and receiving data to and from the electronic device 920.

According to an embodiment, the image sensor module 921 may obtain an image of an external object and may generate raw image data 922 corresponding to the obtained image. The image sensor module 921 may deliver the raw image data 922 to the ISP 923. In various embodiments of the disclosure, the image sensor module 921 may generate small raw image data 926 and may transmit the generated small raw image data 926 to the external electronic device 930 through the communication module. In another embodiment, the processor (e.g., the processor 320) of the electronic device 920 instead of the image sensor module 921 may generate the small raw image data 926 and may transmit the generated small raw image data 926 to the external electronic device 930 through the communication module. The image sensor module 921 may process at least part of the raw image data 922 or may compress at least part of the raw image data 922 to transmit at least part of the raw image data 922 to the outside (e.g., the external electronic device 930). The image sensor module 921 may transmit the compressed raw image data to the ISP 923 or the external electronic device 930 (e.g., the image processing module 933). According to an embodiment, the ISP 923 (e.g., the processor 320) may transmit the raw image data 922, the compressed raw image data, or the small raw image data 926, which is received from the image sensor module 921, to the external electronic device 930. The image sensor module 921 may compress a part of the raw image data 922 and may temporarily store the compressed part of the raw image data 922 in a memory inside the image sensor module 921.

According to an embodiment, the recognition module 931 may obtain the small raw image data 926 through the communication module and may segment at least one image region from the small raw image data 926. The recognition module 931 may recognize each of the separated at least one or more image regions by performing segmentation. According to an embodiment, image correction information 932 may be generated including at least one of information (e.g., coordinate information or recognition result of the image region) associated with a plurality of image regions generated from the recognition module 931. The image correction information 932 may be transmitted to the electronic device 920. The ISP 923 may generate the corrected image by correcting the raw image data 922 using the image correction information 932. For example, the corrected image may have the format of YUV. The corrected image may be stored in the memory 925. For another example, the corrected image may be compressed depending on the Joint Photographic Experts Group (JPEG) specification, and the compressed image may be stored in the memory 925.

According to an embodiment, the raw image data 922 generated by the image sensor module 921 may be transmitted to the external electronic device 930 separately from the small raw image data 926. For example, because the raw image data 922 has a larger capacity than the small raw image data 926, the small raw image data 926 may be first transmitted to the external electronic device 930; afterward, the raw image data 922 may be transmitted to the external electronic device 930. In another embodiment, the raw image data 922 may be transmitted to the external electronic device 930 while the ISP 923 corrects the raw image data 922. The raw image data 922 may be uploaded to the external electronic device 930 generated by the image sensor module 921 as it is; alternatively, the preprocessed image in which lens distortion compensation or noise removal is performed may be uploaded. Preprocessing may be performed by the external electronic device 930. The external electronic device 930 may perform demosaic processing, image format modification, or preprocessing to increase image recognition rate.

According to an embodiment, the image processing module 933 of the external electronic device 930 may correct the received raw image data 922. The external electronic device 930 may correct the raw image data 922, using the previously generated image correction information 932; alternatively, the external electronic device 930 may correct the raw image data 922 using the extended image correction information. Because the raw image data 922 may have a higher resolution than the small raw image data 926, the image processing module 933 of the external electronic device 930 may obtain extended image correction information from the high quality image. The image processing module 933 may generate the extended image correction information, using the previously generated image correction information and the raw image data 922 together. The image processing module 933 may obtain a high quality image 934 by correcting the raw image data 922 using the extended image correction information. The high quality image 934 may be stored in the storage 935 of the external electronic device 930 and may be downloaded by the electronic device 920.

According to various embodiments, the small raw image data 926 refers to raw image data having a size smaller than the data size of the raw image data 922, and the small raw image data 926 is not to be interpreted as being limited to the image data generated by means of a specific format or method. For example, the small raw image data 926 may be generated by reducing the capacity of the raw image data 922 and may be referred to as a small-data size image. For example, the electronic device 920 may generate the small raw image data 926 from the raw image data 922 using various down-scale schemes or down-sampling schemes. For example, the electronic device 920 may perform at least one of the adjustment of the resolution of the raw image data 922, the selection of at least part of the plurality of frequency bands, or the selection of the at least one of the plurality of bit plane levels, and thus may generate the small raw image data 926 having a size smaller than that of the raw image data 922. For example, the electronic device 920 may generate the small raw image data 926 by extracting a low frequency band from the raw image data 922. For example, the electronic device 920 may generate the small raw image data 926 by selecting bit plane levels of some of the plurality of bit plane levels of the raw image data 922. The small raw image data 926 may include at least part of the information of the raw image data 922 and may have a smaller capacity than the raw image data 922. When the small raw image data 926 is transmitted to the external electronic device 930 instead of the raw image data 922, because the data of the smaller size is transmitted, the image may be rapidly transmitted to the external electronic device 930.

Figure 10:
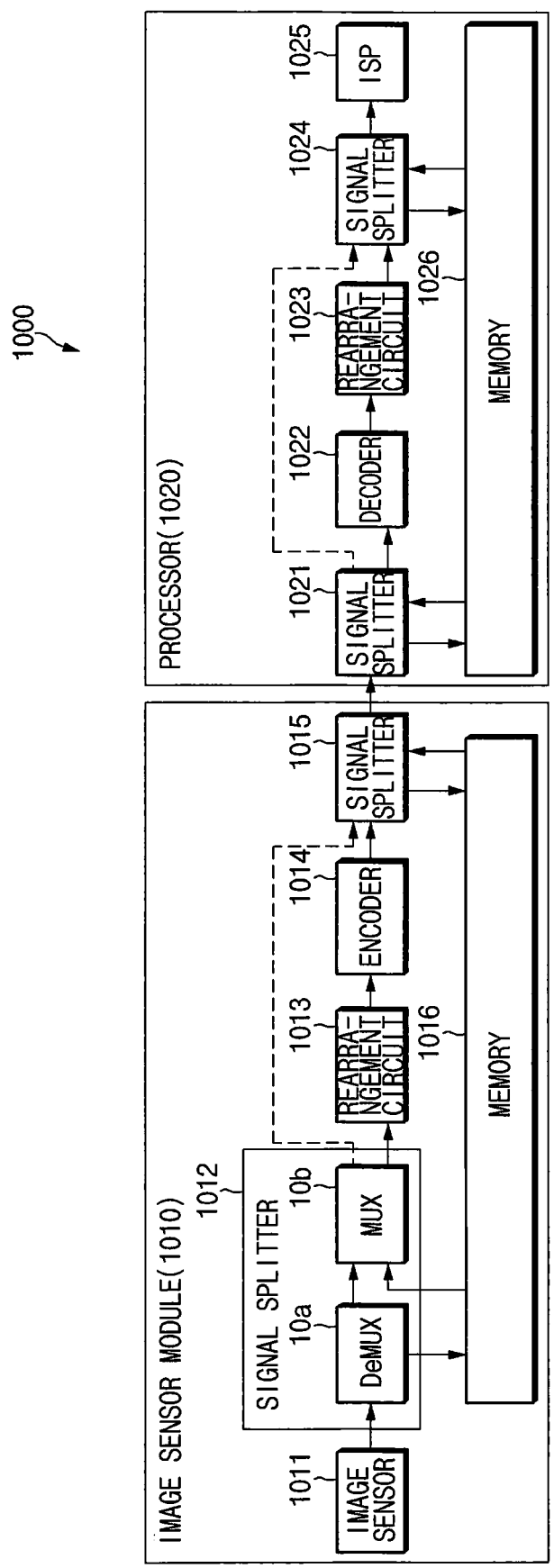
FIG. 10 is a block diagram of an electronic device processing an image, according to an embodiment.

FIG. 10 is a block diagram of an electronic device processing an image, according to an embodiment.

Referring to FIG. 10, an electronic device 1000 (e.g., the electronic device 101) may include an image sensor module 1010 (e.g., the image sensor module 310) and a processor 1020 (e.g., the processor 120). In the description of FIG. 10, the content that overlaps with the description of FIG. 3 and the description of FIG. 4 may be omitted.

The image sensor module 1010 may include an image sensor, a signal splitter 1012, a rearrangement circuit 1013, an encoder 1014, a signal splitter 1015, and a memory 1016. In an embodiment, the component not shown may be added or a part of the components may be omitted.

The signal splitter 1012 may include a demultiplexer 10a and a multiplexer 10b. The demultiplexer 10a may output the input signal by selecting one of several paths. The multiplexer 10b may output the signal entered from several paths through a single path. The signal splitter 1015 may include the configuration the same as or similar to the configuration of the signal splitter 1012.

According to an embodiment, the signal splitter 1012 may distribute the path of the entered signal. For example, the signal (e.g., raw image data) entered from the image sensor 1011 may be distributed to a path through which the signal is transmitted to the rearrangement circuit 1013 after being temporarily stored in the memory 1016 or a path through which the signal is transmitted directly to the rearrangement circuit 1013 without being stored in the memory 1016.

According to an embodiment, the signal splitter 1012 may distribute the path of the entered signal based on the processing speed of the rearrangement circuit 1013. For example, when the processing speed of the rearrangement circuit 1013 is slower than the output speed of the image sensor 1011, the signal splitter 1012 may temporarily store the signal entered from the image sensor 1011 in the memory 1016. The signal stored in the memory 1016 may be buffered and may be entered into the rearrangement circuit 1013 in a timely manner.

According to an embodiment, the signal splitter 1015 may play a role similar to the signal splitter 1012. In an embodiment, the signal splitter 1015 may distribute the path of the signal entered from the encoder 1014 based on the processing speed of the processor 1020. For example, when the processing speed of the processor 1020 is slower than the output speed of the encoder 1014, the signal splitter 1015 may temporarily store the signal entered from the encoder 1014 in the memory 1016. The signal stored in the memory 1016 may be buffered and may be entered into the processor 1020 in a timely manner.

According to an embodiment, the signal output from the signal splitter 1012 may be directly transmitted to the signal splitter 1015 without passing through the rearrangement circuit 1013 and the encoder 1014. In an embodiment, the signal output from the image sensor 1011 may be directly transmitted to the processor without passing through the signal splitter 1012, the rearrangement circuit 1013, the encoder 1014, and the signal splitter 1015. For example, when the image sensor 1011 does not output a signal at a fast speed of a threshold value or more, the output signal may be directly transmitted to the processor without passing through the rearrangement circuit 1013 and the encoder 1014. When the image sensor 1011 does not output a signal at the fast speed of the threshold value or more, because the capacity of the signal transmitted to the processor may be relatively small, the signal may be transmitted to the processor without performing rearrangement and compression.

In this case, the processor 1020 may include a signal splitter 1021, a decoder 1022, a rearrangement circuit 1023, a signal splitter 1024, an image signal processor (ISP) 1025, and a memory 1026.

According to an embodiment, the signal splitter 1021 and the signal splitter 1024 may include a configuration the same as or similar to the signal splitter 1012 or the signal splitter 1015. Furthermore, the signal splitter 1021 and the signal splitter 1024 may play a role similar to the signal splitter 1012 or the signal splitter 1015.

According to an embodiment, the signal splitter 1021 may distribute the path of the entered signal based on the processing speed of the decoder 1022. For example, when the processing speed of the decoder 1022 is slower than the transmission speed of the image sensor module 1010, the signal splitter 1021 may temporarily store the signal entered from the image sensor module 1010 in the memory 1026. The signal stored in the memory 1026 may be buffered and may be entered into the decoder 1022 in a timely manner.

According to an embodiment, the signal splitter 1024 may distribute the path of the entered signal based on the processing speed of the ISP 1025. For example, when the processing speed of the ISP 1025 is slower than the output speed of the rearrangement circuit 1023, the signal splitter 1024 may temporarily store the signal entered from the rearrangement circuit 1023 in the memory 1026. The signal stored in the memory 1026 may be buffered and may be entered into the ISP 1025 in a timely manner.

According to an embodiment, the signal output from the signal splitter 1021 may be directly transmitted to the signal splitter 1024 without passing through the decoder 1022 and the rearrangement circuit 1023. In an embodiment, the signal transmitted from the image sensor module 1010 may be directly transmitted to the ISP 1025 without passing through the signal splitter 1021, the decoder 1022, the rearrangement circuit 1023, and the signal splitter 1024. For example, when the signal output from the image sensor 1011 is transmitted to the processor 1020 without performing rearrangement and compression in the image sensor module 1010, the signal may not need to be rearranged or decompressed and thus may be directly transmitted to the ISP 1025.

According to embodiments disclosed in the specification, an electronic device (e.g., the electronic device 101 of FIG. 1) may rearrange the image data generated by an image sensor such that pieces of pixel data having the same attribute are adjacent to each other. The electronic device may compress image data at a higher compression rate through the rearrangement.

When the compression rate of image data is improved, the electronic device may transmit the same image data more quickly and efficiently in the case of transmitting the same image data. That is, the transmission efficiency of the electronic device may be improved. Moreover, in the electronic device, the storage efficiency may be improved and the usage efficiency of the memory required to transmit the image data may be improved.

According to embodiments disclosed in the specification, because the rearrangement process may be applied to different image sensors for each manufacturer, the method of rearranging and transmitting the image data may be also excellent in terms of utility.

According to an embodiment, an electronic device may include a processor and an image sensor module. The image sensor module may include an image sensor in which one or more sensor pixels are arranged and a control circuit electrically connected to the image sensor and connected to the processor through an interface. The control circuit may be configured to obtain raw image data including pieces of image pixel data, in which one or more first pixel data corresponding to a first attribute and one or more second pixel data corresponding to a second attribute are arranged in a first array, using the image sensor, to identify rearrangement information, which is predetermined based on the first attribute and the second attribute and includes information for changing an array of the pieces of image pixel data, to change the array of the pieces of image pixel data into a second array based on the rearrangement information such that at least part of the one or more first pixel data is arranged adjacent and at least part of the one or more second pixel data is arranged adjacent, to generate compression data obtained by compressing the pieces of image pixel data whose array is changed into the second array, and to transmit the compression data to the processor. The processor may be configured to restore the raw image data, using the compression data.

According to an embodiment, each of the first array and the second array may include at least one or more rows, and the control circuit may change the array of the pieces of image pixel data into a second array such that pieces of pixel data corresponding to the same attribute are arranged adjacent for the respective at least one or more rows.

According to an embodiment, the electronic device may further include a line buffer. The control circuit may change the array of the pieces of image pixel data into a second array such that pieces of pixel data corresponding to the same attribute are arranged adjacent for the respective at least one or more rows, using the line buffer.

According to an embodiment, the rearrangement information may include index information of counterpart sensor pixels configured such that the pixel data is exchanged with respect to each of the first sensor pixels and the second sensor pixels, and the control circuit may be configured to exchange pixel data of the first sensor pixels and pixel data of the second sensor pixels with each other, using the index information as an operation of changing the array of the pieces of image pixel data into a second array.

According to an embodiment, the processor may be configured to change the array of the pieces of image pixel data to a first array based on the rearrangement information, as an operation of restoring the raw image data.

According to an embodiment, the first attribute may be specified as an exposure value for light, and the first attribute may indicate an exposure value greater than the second attribute.

According to an embodiment, each of the first sensor pixel and the second sensor pixel may include a first photo detector and a second photo detector. The control circuit may be configured to change the array of the pieces of image pixel data into a second array such that pieces of pixel data of the first photo detectors are arranged adjacent to each other and pieces of pixel data of the second photo detectors are arranged adjacent to each other.

According to an embodiment, the first array may include one of a bayer pattern, a red-green-blue-emerald (RGBE) pattern, a cyan-yellow-yellow-magenta (CYYM) pattern, a cyan-yellow-green-magenta (CYGM) pattern, a red-green-blue-white (RGBW) pattern, and an X-trans pattern. The control circuit may be configured to change the pieces of image pixel data into the second array based on the rearrangement information corresponding to the one.

According to an embodiment, the image sensor module may further include a memory. The control circuit may perform buffering by storing the obtained raw image data in the memory in consideration of a processing speed of the image sensor module.

In an embodiment, the processor may further include a memory. The processor may perform buffering by storing the transmitted compression data in the memory in consideration of a processing speed of the processor.

In an embodiment, the control circuit may be configured to determine whether to perform an operation of changing the array of the pieces of image pixel data and an operation of generating the compression data, based on a processing speed of the image sensor and to transmit the raw image data to a processor when the operation of changing the array of the pieces of image pixel data and the operation of generating the compression data are not performed.

According to an embodiment, the image sensor module may include an image sensor including at least one pixel sensing light reflected from a subject or light generated by the subject, a rearrangement circuit, an encoder, and a transmitter. The pixel may generate pixel data categorized into at least one attributes. The image sensor may be configured to generate raw image data including at least one sub image data in which the pixel data is arranged to constitute a first array based on the attribute. The rearrangement circuit may change the array of the sub image data from the first array to the second array such that the at least one pixel data has the same attribute as a part of adjacent pixel data, based on predetermined rearrangement information. The encoder may be configured to compress the rearranged sub image data. The transmitter may be configured to transmit raw image data including the compressed sub image data to a processor connected to the image sensor module through an interface.

According to an embodiment, each of the first array and the second array may include at least one or more rows, and the rearrangement circuit may change the array of the sub, image data from the first array to the second array such that pieces of pixel data corresponding to the same attribute are arranged adjacent to each other for the respective at least one or more rows.

According to an embodiment, the image sensor module may further include a line buffer. The rearrangement circuit may change the array of the sub image data from the first array to the second array such that pieces of pixel data corresponding to the same attribute are arranged adjacent to each other for the respective at least one or more rows.

According to an embodiment, the changing, by the rearrangement circuit, the array of the sub image data from the first array to the second array such that the at least one pixel data has the same attribute as the part of adjacent pixel data, based on the rearrangement information may include exchanging, by the rearrangement circuit, the pixel data with the one or more pixels in a specified manner. The rearrangement information may include index information of the counterpart pixels configured such that the pixel data is exchanged, with respect to each of the pixels.

According to an embodiment, the at least one or more attributes may be determined based on an exposure value of the sensor pixel for light.

According to an embodiment, the at least one or more attributes may be determined based on a color sensed by the sensor pixel.

According to an embodiment, the at least one pixel may include a first photo detector and a second photo detector. The at least one or more attributes may include the attribute corresponding to the first photo detector and the attribute corresponding to second photo detector.

According to an embodiment, the first array may include one of a bayer pattern, an RGBE pattern, a CYYM pattern, a CYGM pattern, an RGBW pattern, and an X-trans pattern.

According to an embodiment, a method in which an electronic device processes an image may include obtaining raw image data corresponding to light reflected from a subject or light generated from the subject, changing an array of at least one sub image data included in the raw image data from a first array to a second array, based on predetermined rearrangement information, and compressing the rearranged sub image data.

According to an embodiment, the method in which the electronic device processes the image may further include transmitting raw image data including the compressed sub image data to a processor.

According to an embodiment, the method in which the electronic device processes the image may further include decompressing, by the processor, compression of the transmitted raw image data.

According to an embodiment, the method in which the electronic device processes the image may further include changing an array of at least one sub image data included in the decompressed raw image data from a second array to a first array.

The electronic device according to various embodiments disclosed in the disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be understood that various embodiments of the disclosure and terms used in the embodiments do not intend to limit technologies disclosed in the disclosure to the particular forms disclosed herein; rather, the disclosure should be construed to cover various modifications, equivalents, and/or alternatives of embodiments of the disclosure. With regard to description of drawings, similar components may be assigned with similar reference numerals. As used herein, singular forms may include plural forms as well unless the context clearly indicates otherwise. In the disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the disclosure may be implemented by software (e.g., the program 140) including an instruction stored in a machine-readable storage media (e.g., an internal memory 136 or an external memory 138) readable by a machine (e.g., a computer). The machine may be a device that calls the instruction from the machine-readable storage media and operates depending on the called instruction and may include the electronic device (e.g., the electronic device 101). When the instruction is executed by the processor (e.g., the processor 120), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the disclosure may be executed sequentially, in parallel, repeatedly, or in a heuristic method. Also, at least some operations may be executed in different sequences, omitted, or other operations may be added.

The invention claimed is:

1. An electronic device comprising:
a processor; and
an image sensor module,
wherein the image sensor module includes:
an image sensor in which one or more sensor pixels are arranged; and
a control circuit electrically connected to the image sensor and connected to the processor through an interface,
wherein the control circuit is configured to:
obtain raw image data including pieces of image pixel data, in which one or more first pixel data corresponding to a first attribute and one or more second pixel data corresponding to a second attribute are arranged in a first array, using the image sensor,
identify rearrangement information, which is predetermined based on the first attribute and the second attribute and includes information for changing an array of the pieces of image pixel data,
change the array of the pieces of image pixel data into a second array based on the rearrangement information such that at least part of the one or more first pixel data is arranged adjacent and at least part of the one or more second pixel data is arranged adjacent, generate compression data obtained by compressing the pieces of image pixel data whose array is changed into the second array, and transmit the compression data to the processor, and wherein the processor is configured to:

restore the raw image data, using the compression data.

2. The electronic device of claim 1, wherein each of the first array and the second array includes at least one or more rows, and wherein the control circuit changes the array of the pieces of image pixel data into the second array such that pieces of pixel data corresponding to the same attribute are arranged adjacent for the respective at least one or more rows.

3. The electronic device of claim 2, further comprising:

a line buffer, wherein the control circuit changes the array of the pieces of image pixel data into the second array such that pieces of pixel data corresponding to the same attribute are arranged adjacent for the respective at least one or more rows, using the line buffer.

4. The electronic device of claim 1, wherein the rearrangement information includes index information of counterpart sensor pixels configured such that the pixel data is exchanged with respect to each of the first sensor pixels and the second sensor pixels, and wherein the control circuit is configured to:

as an operation of changing the array of the pieces of image pixel data into the second array, exchange pixel data of the first sensor pixels and pixel data of the second sensor pixels with each other, using the index information.

5. The electronic device of claim 1, wherein the processor is configured to:

as an operation of restoring the raw image data, change the array of the pieces of image pixel data to the first array based on the rearrangement information.

6. The electronic device of claim 1, wherein the first attribute and second attribute are capable of being specified as an exposure value for light, and wherein the first attribute indicates an exposure value greater than the second attribute.

7. The electronic device of claim 1, wherein each of the first sensor pixel and the second sensor pixel includes a first photo detector and a second photo detector, and wherein the control circuit is configured to:

change the array of the pieces of image pixel data into the second array such that pieces of pixel data of a first photo detectors are arranged adjacent to each other and pieces of pixel data of a second photo detectors are arranged adjacent to each other.

8. The electronic device of claim 1, wherein the first array includes one of a bayer pattern, a red-green-blue-emerald (RGBE) pattern, a cyan-yellow-yellow-magenta (CYYM) pattern, a cyan-yellow-green-magenta (CYGM) pattern, a red-green-blue-white (RGBW) pattern, and an X-trans pattern, and wherein the control circuit is configured to:

change the pieces of image pixel data into the second array based on the rearrangement information corresponding to the one.

9. The electronic device of claim 1, wherein the image sensor module further includes a memory, and wherein the control circuit performs buffering by storing the obtained raw image data in the memory in consideration of a processing speed of the image sensor module.

10. The electronic device of claim 1, wherein the processor further includes a memory, and wherein the processor performs buffering by storing the transmitted compression data in the memory in consideration of a processing speed of the processor.

11. The electronic device of claim 1, wherein the control circuit is configured to:

determine whether to perform an operation of changing the array of the pieces of image pixel data and an operation of generating the compression data, based on a processing speed of the image sensor; and when the operation of changing the array of the pieces of image pixel data and the operation of generating the compression data are not performed, transmit the raw image data to the processor.

12. A method in which an electronic device processes an image, the method comprising:

obtaining raw image data corresponding to light reflected from a subject or light generated by the subject;

changing an array of at least one sub image data included in the raw image data from a first array to a second array, based on predetermined rearrangement information; and compressing the rearranged sub image data.

13. The method of claim 12, further comprising:

transmitting the raw image data including the compressed sub image data to a processor.

14. The method of claim 13, further comprising:

decompressing, by the processor, compression of the transmitted raw image data.

15. The method of claim 14, further comprising:

changing an array of at least one sub image data included in the decompressed raw image data from the second array to the first array.

* * * * *